(12) United States Patent
Fujishiro et al.

(10) Patent No.: US 8,503,262 B2
(45) Date of Patent: Aug. 6, 2013

(54) SEMICONDUCTOR DEVICE INCLUDING MEMORY CELLS THAT REQUIRE REFRESH OPERATION

(75) Inventors: Keisuke Fujishiro, Tokyo (JP); Sachiko Kamisaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 247 days.

(21) Appl. No.: 13/067,329

(22) Filed: May 25, 2011

(65) Prior Publication Data

US 2011/0299352 A1  Dec. 8, 2011

(30) Foreign Application Priority Data

Jun. 7, 2010  (JP) ................................. 2010-130185

(51) Int. Cl.
*G11C 7/00* (2006.01)

(52) U.S. Cl.
USPC .................. 365/222; 365/230.02; 365/230.05

(58) Field of Classification Search
USPC .................... 365/189.02, 222, 230.02, 230.05
See application file for complete search history.

(56) References Cited

U.S. PATENT DOCUMENTS

| 7,551,502 | B2 | 6/2009 | Dono et al. | |
|---|---|---|---|---|
| 7,697,360 | B2 | 4/2010 | Dono et al. | |
| 2003/0043672 | A1* | 3/2003 | Inoue et al. | 365/222 |
| 2004/0042330 | A1* | 3/2004 | Matsubara | 365/232 |

FOREIGN PATENT DOCUMENTS

JP  2006-323909 A  11/2006

* cited by examiner

*Primary Examiner* — Alexander Sofocleous
*Assistant Examiner* — Hien Nguyen
(74) *Attorney, Agent, or Firm* — McGinn IP Law Group, PLLC

(57) ABSTRACT

A semiconductor device includes a first circuit that generates a self refresh signal in a predetermined cycle asynchronous with a cycle set externally, a second circuit that generates a refresh address in response to the self refresh signal and updates the refresh address and outputs the refresh address, a third circuit that retains a relief address, a fourth circuit that counts number of generation of the self refresh signal and activates an interrupt signal when a count of the number of generation reaches a predetermined count, a fifth circuit that specifies the refresh address when the interrupt signal is in an inactive state and specifies the relief address when the interrupt signal is in an active state, and a sixth circuit that performs a refresh operation on memory cells specified by the selected refresh address or the relief address. The second circuit temporarily stops updating the refresh address in response to activation of the interrupt signal.

16 Claims, 8 Drawing Sheets

SEMICONDUCTOR DEVICE INCLUDING MEMORY CELLS THAT REQUIRE REFRESH OPERATION

BACKGROUND OF THE INVENTION

1. Field of the Invention

The present invention relates to a semiconductor device, and more particularly relates to a semiconductor device including memory cells that require a refresh operation for retaining information.

2. Description of Related Art

DRAMs (Dynamic Random Access Memory) that are representative semiconductor devices are volatile semiconductor memory devices. In DRAMs, because information is stored as an electric charge in capacitors that are included in memory cells, information is lost due to a leakage current if a refresh operation is not performed periodically. Therefore, it is necessary to refresh all memory cells before the information is lost due to the leakage current. A period (=tREF) of 64 milliseconds (msec) is defined as a standard for refreshing all the memory cells. Auto refresh commands issued by a controller in succession in a time series are issued in such a manner that all word lines associated with all the memory cells are selected within the period of 64 msec. It is not necessary to input a refresh address when issuing the auto refresh commands. That is, a refresh address associated with a word line to be refreshed is automatically generated by a refresh address counter provided in the DRAMs.

For example, if there are 8192 refresh addresses (=8192 word lines), the controller issues an auto refresh command 8192 times within a period of 64 msec. Therefore, one cycle of a count value of the refresh address counter is completed in 64 msec. As long as the auto refresh command is issued 8192 times within the period of 64 msec, the auto refresh commands can be issued at an arbitrary timing. As a first example, the auto refresh commands can be issued at substantially equal intervals (an interval of approximately 7.8 microseconds ($\mu$sec)) within the period of 64 msec. As a second example, the auto refresh commands can be issued 8192 times concentrically in a fixed period of time within the period of 64 msec. The command issuing method in the first example is sometimes called "distributed refresh method" and that in the second example is called "concentrated refresh method". In the concentrated refresh method, the interval for issuing the auto refresh commands needs to be equal to or greater than a minimum issue interval tRFC defined according to specifications (such as 100 nanoseconds (nsec)). However, the concentrated refresh method may not be used for some specifications.

A mode described above in which the refresh operation is performed in response to the auto refresh command is called "auto refresh mode". On the other hand, unlike the auto refresh mode, there is a self refresh mode that automatically (autonomously) performs a periodic refresh operation in a semiconductor device. Once entered in the self refresh mode, the refresh operation is automatically performed at the interval of approximately 7.8 $\mu$sec based on the distributed refresh method using a timer (an internal timer) provided in the semiconductor device.

Meanwhile, among memory cells, some memory cells have a shorter information retaining time than the rest of the memory cells (which are in majority). A refresh operation needs to be performed more frequently for such memory cells with a shorter information retaining time as compared to the other memory cells to prevent loss of information. For example, the third embodiment of Japanese Patent Application Laid-open No. 2006-323909 discloses a method in which, when a refresh address indicated by a refresh address counter corresponds to a predetermined value, a refresh operation is performed for memory cells with a shorter information retaining time instead of for a memory cell actually indicated by the refresh address in the refresh address counter. The refresh operation is performed for the refresh address actually indicated by the refresh address counter in response to the auto refresh command that is issued after the refresh operation for the memory cell with a shorter information retaining time is performed. Because the refresh operation of the memory cell with a shorter information retaining time is periodically interrupted by the refresh operation of the normal memory cells, the memory cell with a shorter information retaining time can be frequently refreshed.

However, in the method disclosed in Japanese Patent Application Laid-open No. 2006-323909, because the refresh operation of the memory cell with a shorter information retaining time is periodically interrupted, the refresh operation cannot be completed for all refresh addresses only by issuing the auto refresh command by a controller strictly 8192 times within a period of 64 msec. That is, assuming that the number of the refresh operation that is interrupted during one counting cycle of the refresh counter is m, the refresh operation cannot be completed for all refresh addresses unless the auto refresh command is issued 8192+m times. That is, the refresh operation cannot be performed for m addresses by only issuing the auto refresh commands 8192 times.

Note that such a problem does not occur in the distributed refresh method or in the self refresh mode based on the distributed refresh method. This is because, in the distributed refresh method and the self refresh mode based on the distributed refresh method, the refresh operation is performed at substantially equal intervals. Therefore, a length of a refresh cycle for each refresh address is increased only by a small extent (64 msec+$\alpha$), even if the refresh operation needs to be performed 8192+m times for completing the refresh operation for all refresh addresses.

On the other hand, in the concentrated refresh method, because the auto refresh command is issued a plurality of times all at once within a fixed period of time, memory cells that are not refreshed during the period when the auto refresh commands are issued are not refreshed until after approximately 64 msec have elapsed. This means that the refresh interval is approximately doubled (128 msec) for the m refresh addresses. As a result, there is a possibility that information cannot be retained properly.

The problem described above is not limited to DRAMs, also occurs in all semiconductor devices that require a refresh operation due to the memory cell configuration thereof.

SUMMARY

In one embodiment, there is provided a semiconductor device includes a first circuit that generates a refresh command in a predetermined cycle asynchronous with outside; a second circuit that generates a refresh address in response to the refresh command and updates the refresh address and outputs the refresh address; a third circuit that stores a relief address; a fourth circuit that counts number of generation of the refresh command and activates an interrupt signal when a count value thereof reaches a predetermined value; a fifth circuit that selects the refresh address output from the second circuit when the interrupt signal is in an inactive state, and selects the relief address stored in the third circuit when the interrupt signal is in an active state; and a sixth circuit that performs a refresh operation to memory cells specified by the refresh address or the relief address selected by the fifth circuit, wherein the second circuit temporarily stops updating the refresh address in response to activation of the interrupt signal.

In another embodiment, there is provided a semiconductor device includes a refresh-command generating circuit that enters into a self refresh mode in response to a self refresh command issued once from outside of the semiconductor device, the refresh-command generating circuit periodically activating a plurality of first refresh commands during the self refresh mode, and activating a second refresh command once in response to an auto refresh command issued once from outside of the semiconductor device during not the self refresh mode; a refresh address counter that updates a count value in response to activation of either the first refresh commands or second refresh command, the count value indicating an address to be refreshed; a self refresh counter that updates a count value in response to activation of the first refresh commands; and a control circuit that generates an interrupt signal when the count value of the self refresh counter indicates a predetermined value, wherein the control circuit performs a refresh operation for a relief address instead of an address supplied from the refresh address counter and suspends counting of the refresh address counter when both ones of the first refresh commands and the interrupt signal are activated, and the control circuit further performs a refresh operation for an address supplied from the refresh address counter and permits counting of the refresh address counter in response to activation of ones of the first refresh commands when the interrupt signal is not activated.

According to the present invention, the number of generation of a refresh command that is generated in a predetermined cycle asynchronous with a cycle set externally is counted, and upon the count reaching a predetermined number of generation, a refresh operation is interrupted. Consequently, even entry into and exit from a self refresh mode are repeated, the refresh operation can be frequently performed for a relief address, and the relief address (memory cell) with a shorter information retaining time can be surely retained. Furthermore, when an auto refresh command is issued in the concentrated refresh method from outside of a semiconductor device, the number of generation of the refresh command in response to the auto refresh command is not counted, and therefore the refresh operation associated with a relief address with a shorter information retaining time is not interrupted. Consequently, a refresh, interval is not doubled.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, the technical concept of the present invention is to count the number of generation of a refresh command activated in a self refresh mode instead of counting the number of generation of a refresh command in response to an auto refresh command, and once the count reaches a predetermined number, to interrupt a refresh operation of an address supplied by a refresh address counter with a refresh operation of a relief address. With this configuration, even if entry into and exit from the self refresh mode are repeated, the refresh operation can be frequently performed for the relief address.

Figure 1:
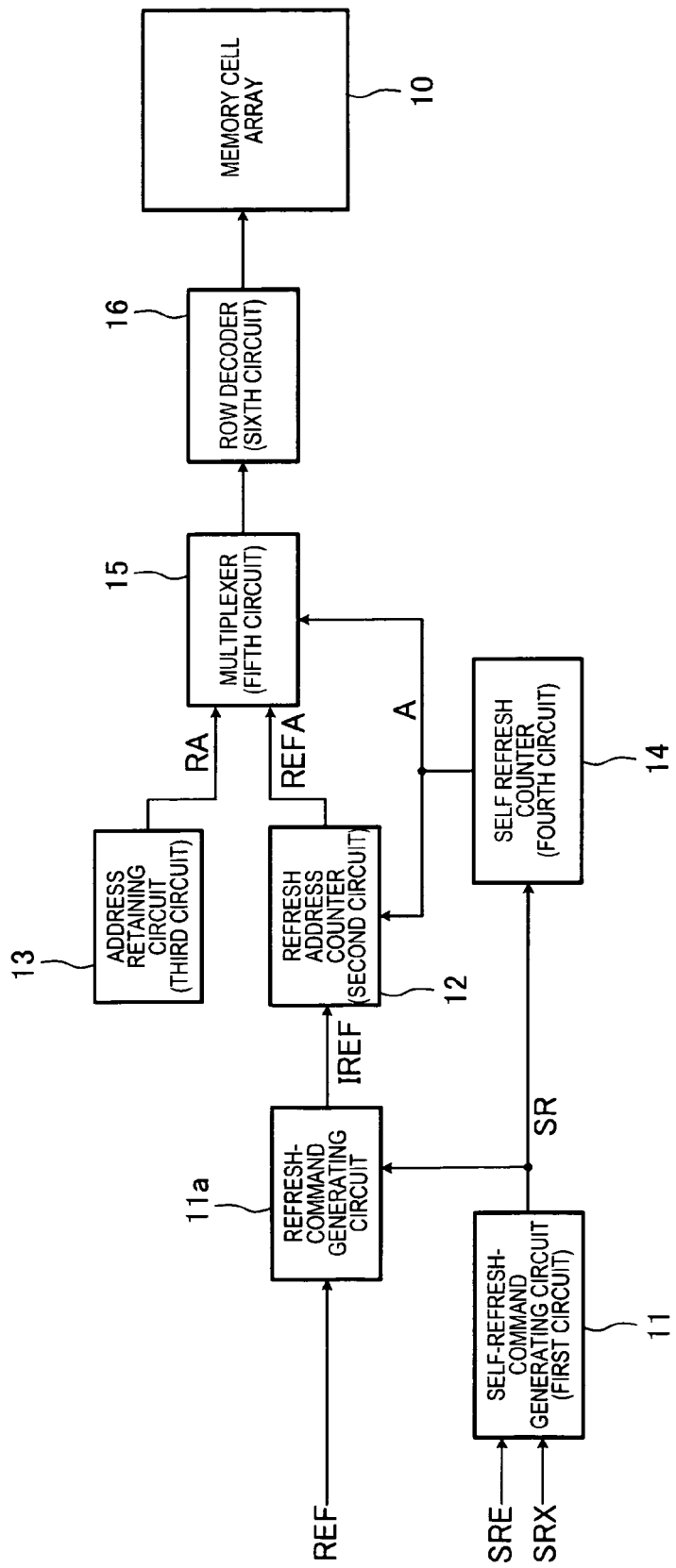
FIG. 1 is a block diagram for explaining a principle of the present invention.

FIG. 1 is a block diagram for explaining a principle of the present invention.

In the present invention, a semiconductor device, for example, a DRAM includes a memory cell array 10 that includes memory cells that require a refresh operation for retaining information. The memory cell array 10 is connected to word lines and bit lines. A refresh address REFA is an address that is relevant to the word lines. The refresh operation is performed in response to an auto refresh command REF or a self-refresh entry command SRE that are supplied to the semiconductor device from outside. These commands are issued to the semiconductor device from an external controller.

When the auto refresh command REF is issued once, a refresh-command generating circuit 11a activates a refresh command IREF once. When the refresh command IREF is activated, the refresh address REFA indicated by a count value of a refresh address counter (second circuit) 12 is supplied to a row decoder (sixth circuit) 16. The refresh operation is performed for a memory cell that is identified by the refresh address REFA, and the count value of the refresh address counter 12 is incremented or decremented. The count value of the refresh address counter 12 indicates an address that is to be used during the next refresh operation.

On the other hand, when the self-refresh entry command SRE is issued once, the semiconductor device enters into the self refresh mode. Specifically, a self-refresh-command generating circuit (first circuit) 11 autonomously and automatically activates a self refresh signal SR in a predetermined cycle asynchronous with a cycle set outside of the semiconductor device. The self refresh signal SR is a self-refresh request signal. When the self refresh signal SR is activated once, the refresh-command generating circuit 11a activates the refresh command IREF once. The operation when the refresh command IREF is activated is as described above. The self refresh operation continues until a self-refresh exit command SRX is issued from outside.

In the self refresh mode, a self refresh counter (fourth circuit) 14 counts and checks the number of generation of the self refresh signal SR. In other words, the self refresh counter (fourth circuit) 14 checks the number of generation of the self-refresh request signal and measures how many times the self refresh operation has been performed. Because instead of the refresh command IREF, the self refresh signal SR is supplied to the self refresh counter 14, the number of generation of the refresh command IREF issued in response to the auto refresh command REF is not counted. Furthermore, a count value of the self refresh counter 14 is not reset and is retained even when exiting from the self refresh mode.

Once the count value reaches a predetermined value, the self refresh counter 14 activates an interrupt signal A. When the interrupt signal A is activated, a multiplexer (fifth circuit) 15 selects a relief address RA retained by an address retaining circuit (third circuit) 13 instead of the refresh address REFA that is an output of the refresh address counter 12, and outputs the selected relief address RA to the row decoder 16. The relief address RA is an address of a memory cell with a shorter information retaining time. The refresh operation is performed for a memory cell that is identified by the relief address RA instead of a memory cell that is identified by the refresh address REFA. The refresh operation of the memory cell that is identified by the refresh address REFA is performed in the next refresh cycle.

The interrupt signal A is also supplied to the refresh address counter 12. When the interrupt signal A is activated, update of the refresh address counter 12 is temporarily stopped. Therefore, the refresh address REFA that is not selected by the multiplexer 15 due to activation of the interrupt signal A is selected when the refresh command IREF is activated the next time.

The principle of the present invention is as described above. With the above configuration, because an interrupt of the relief address RA is performed during the self refresh operation, the memory cell with a shorter information retaining time can be refreshed more frequently than the other memory cells. Furthermore, because an interrupt of the relief address RA is not performed during the auto refresh operation, even if the auto refresh command REF is issued, for example, in the concentrated refresh method, the memory cell with a shorter information retaining time and a normal memory cell with a longer information retaining time can be refreshed in desired cycles.

A preferred embodiment of the present invention is explained below in detail with reference to the drawings.

Figure 2:
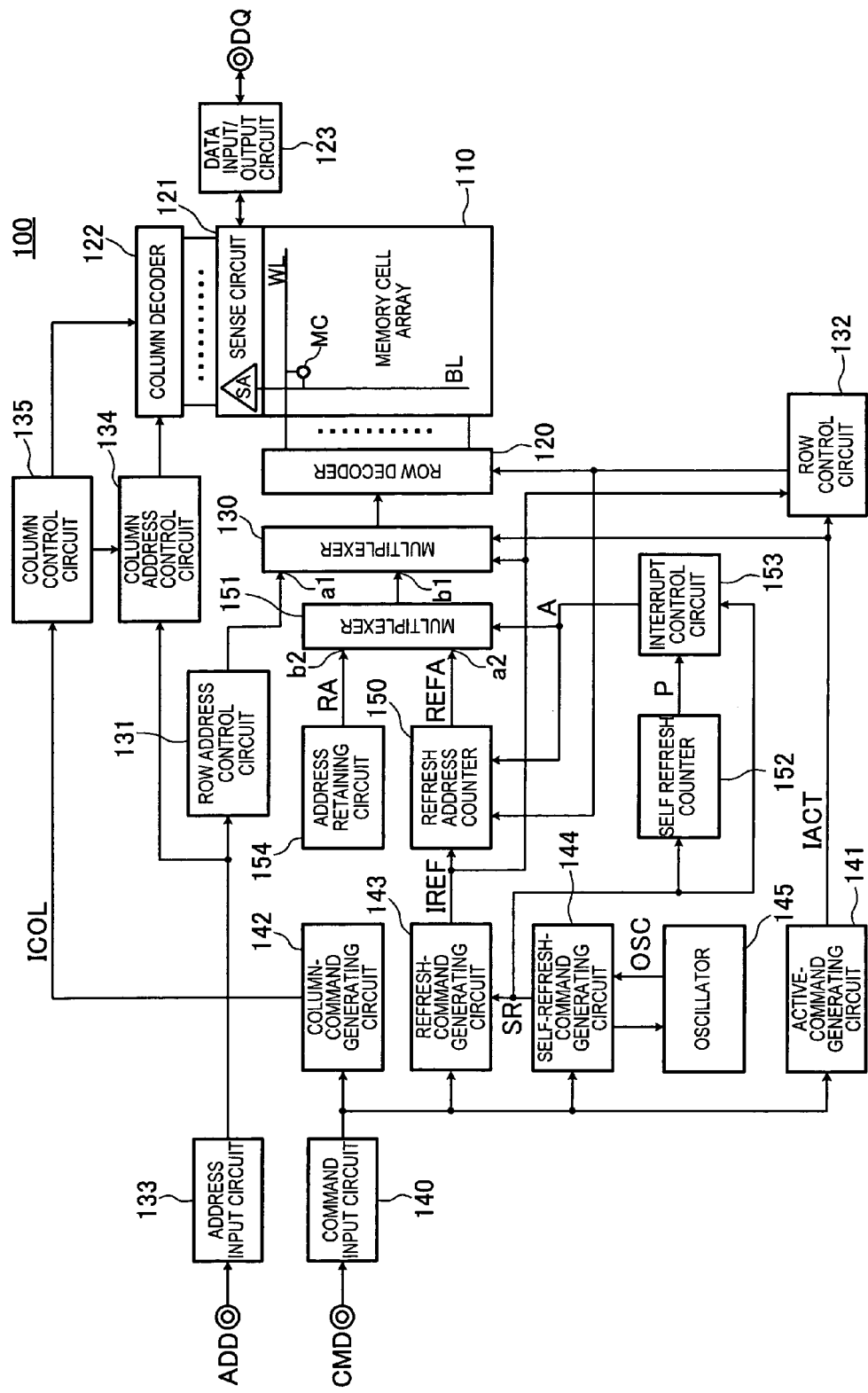
FIG. 2 is a block diagram of a semiconductor device 100 according to the embodiment of the present invention.

FIG. 2 is a block diagram of a semiconductor device 100 according to the embodiment.

As shown in FIG. 2, the semiconductor device 100 according to the present embodiment includes a memory cell array 110 that includes a plurality of memory cells MC. A plurality of word lines WL and a plurality of bit lines BL intersect each other in the memory cell array 110 and the memory cells MC are arranged at the intersections of the word lines WL and the bit lines BL. FIG. 2 shows only one memory cell MC that is arranged at the intersection of one word line WL and one bit dine BL.

A row decoder 120 selects a word line among the word lines WL. The bit lines BL are connected to corresponding sense amplifiers SA in a sense circuit 121. The sense amplifier SA selected by a column decoder 122 is connected to a data input/output circuit 123 that is connected to a data input/output terminal DQ. During a read operation, read data read from the memory cell array 110 is output to outside via the data input/output terminal DQ, and during a write operation, write data input into the data input/output terminal DQ from outside is supplied to the memory cell array 110.

A row address is supplied to the row decoder 120 from a row address control circuit 131 via a multiplexer 130. A row control circuit 132 controls operations of the row decoder 120. The row address control circuit 131 is a circuit to which row addresses among addresses (external addresses) input into an address input circuit 133 via an address terminal ADD are supplied. When a command input into a command input circuit 140 via a command terminal CMD is an active command (ACT command), an active-command generating circuit 141 activates an active command IACT and supplies the command to the row control circuit 132. The active command IACT is also supplied to the multiplexer 130, and when the active command IACT is activated, the multiplexer 130 selects an input node a1. With this configuration, when the active command and the row address are input from outside, the row decoder 120 activates the word line WL indicated by the row address input from outside. When the word line WL is activated, information of all memory cells selected by the word line WL is read out, and amplified by the sense amplifier SA.

On the other hand, column addresses are supplied to the column decoder 122 from a column address control circuit 134. A column control circuit 135 controls operations of the column decoder 122. The column address control circuit 134 is a circuit to which column addresses among the addresses (external addresses) input into the address input circuit 133 via the address terminal ADD are supplied. When a command input into the command input circuit 140 via the command terminal CMD is a column command (read command or write command), a column-command generating circuit 142 activates a read/write command ICOL and supplies the command to the column control circuit 135. With this configuration, when the column command and the column address are input from outside, the column decoder 122 selects the sense amplifier SA indicated by the column address input from outside. As a result, the read data amplified by the sense amplifier SA that is selected during the read operation is output to the data input/output circuit 123 and the write data supplied from the data input/output circuit 123 during the write operation overwrites information of the selected sense amplifier SA.

The commands input into the command terminal CMD include the auto refresh command REF, the self-refresh entry command SRE, and the self-refresh exit command SRX in addition to the active command and the column command.

When the auto refresh command REF is issued, a refresh-command generating circuit 143 activates the refresh command IREF. When the refresh command IREF is activated, a count value of a refresh address counter 150 is updated (incremented or decremented) and the refresh address REFA indicated by the count value is supplied to a multiplexer 151. To be precise, information of the refresh address counter 150 before the counting begins is supplied to the multiplexer 151 in response to the refresh command IREF. Thereafter, the refresh address counter 150 performs counting in response to the refresh command IREF. The multiplexer 151 selects an input node a2 when an interrupt signal A is in an inactive state, and outputs the information output from the refresh address counter 150 to the multiplexer 130. The refresh command IREF that is described above is also supplied to the multiplexer 130. When the refresh-command IREF is activated, the multiplexer 130 selects an input node b1. In this manner, when the auto refresh command REF is issued, the refresh address REFA output from the refresh address counter 150 is supplied to the row decoder 120 and the word line WL indicated by the refresh address REFA is activated. As described above, when the word line WL is activated, information of all the memory cells connected to the activated word line WL is read out, and amplified by the sense amplifier SA, and consequently, all these memory cells are refreshed. The refresh command IREF, which is also supplied to the row control circuit 132, activates the row decoder 120.

Meanwhile, when the self-refresh entry command SRE is issued, a self-refresh-command generating circuit 144 is activated. When the self-refresh-command generating circuit 144 is activated, operations of an oscillator 145 start and a self refresh signal SR (self-refresh request signal) is activated in synchronization with a signal OSC that is supplied from the oscillator 145 in a predetermined cycle asynchronous with an external cycle. The self refresh signal SR is supplied to the refresh-command generating circuit 143. With this configuration, the refresh operation is performed in a manner similar to that when the auto refresh command REF is issued.

Furthermore, the self refresh signal SR is also supplied to a self refresh counter 152. The self refresh counter 152 is a circuit that counts the number of activation of the self refresh signal SR. Once a count value of the self refresh counter 152 reaches a predetermined value, a detection pulse P is generated. The number of the count value required for activating the detection pulse P is not particularly limited; however, the count value needs to be smaller than the count value of the refresh address counter 150 for one counting cycle (one round), and is preferably $½^n$ of the count value of the refresh address counter 150 for one counting cycle. In other words, the detection pulse P is preferably activated a power of two times during one counting cycle of the refresh address counter 150. For example, assuming that the count value of the refresh address counter 150 for one counting cycle is 8192, the detection pulse P is preferably activated whenever the self refresh signal SR is generated 1024 times or 2048 times.

The detection pulse P is also supplied to an interrupt control circuit 153. The interrupt control circuit 153 activates the interrupt signal A in response to the detection pulse P and supplies the signal to the refresh address counter 150 and the multiplexer 151. When the interrupt signal A is activated, the multiplexer 151 selects an input node b2. The relief address RA that is an output of an address retaining circuit 154 is supplied to the input node b2. The relief address RA is an address of a memory cell with a shorter information retaining time relative to the normal memory cells with a longer information retaining time that are in majority. The address retaining circuit 154 stores the addresses of the memory cells with a shorter information retaining time in a nonvolatile manner. How the relief address RA is stored in the address retaining circuit 154 is not particularly limited, and examples thereof include a method by which a storage in a nonvolatile manner is performed by fusing a fuse element with a laser beam or a large current, a method by which a storage in a nonvolatile manner is performed by breaking down an anti-fuse element with a high voltage, and providing nonvolatile memory cell elements such as a known flash memory.

When the interrupt signal A is activated, the refresh address counter 150 temporarily stops the update of the count value in response to the refresh command IREF. This is because, an address of the memory cell with a longer information retaining time that is once postponed due to the interrupt signal A is refreshed when receiving the next refresh operation request. With this configuration, when the interrupt signal A is activated, instead of the refresh address REFA, the relief address RA is supplied to the row decoder 120, and the word line indicated by the relief address RA is refreshed.

Meanwhile, when the self-refresh exit command SRX is issued, the self-refresh-command generating circuit 144 is inactivated and the operations of the oscillator 145 are stopped.

The interrupt control circuit 153, the multiplexers 151 and 130, and the row control circuit 132 are parts of a control circuit.

The overall configuration of the semiconductor device 100 is as described above.

An information retaining time of the memory cell identified by the relief address RA is explained below.

As described above, in a DRAM, the information retaining time of all memory cells needs to be equal to or greater than 64 msec. A memory cell with an information retaining time less than 64 msec is replaced by, for example, a redundant memory cell. Therefore, a controller that controls the DRAM issues the auto refresh command REF in succession such that all word lines can be selected within a period of 64 msec.

However, the information retaining time of the memory cell can be set to a value substantially longer than 64 msec depending on the design. For example, the information retaining time of all the memory cells can be set to equal to or greater than 100 msec. Even in such DRAMs with a longer information retaining time, the controller issues the auto refresh command REF according to specifications so that all the word lines are selected within the period of 64 msec.

On the other hand, when entering into the self refresh mode, no control by the controller is required, and the refresh operation is automatically performed in the DRAM. Therefore, when the information retaining time of the memory cells is sufficiently longer than a time defined by the standards, a longer refresh cycle can be set depending on the information retaining time. As described in the above example, if the information retaining time of all the memory cells is set equal to or greater than 100 msec, the refresh cycle during the self refresh operation can be set to 100 msec. By this, consumption of power during the self refresh operation can be further reduced.

Figure 3:
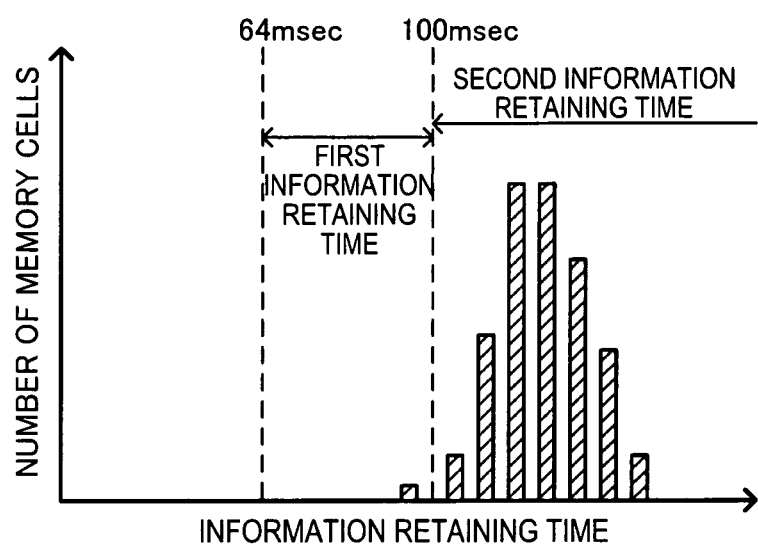
FIG. 3 is a schematic graph showing a distribution of the information retaining times.

However, as shown in FIG. 3, which shows a distribution of the information retaining times, the information retaining time of some of the memory cells is set equal to or greater than 64 msec and less than 100 msec instead of actually setting the information retaining time of all the memory cells to equal to or greater than 100 msec. Even in such a case, because the information retaining time exceeds a lower limit (64 msec) defined by specifications, the memory cells can be shipped as normal chips and the controller can issue the auto refresh command REF such that all the word lines can be selected within the period of 64 msec. However, even if a single memory cell with the information retaining time equal to or greater than 64 msec and less than 100 msec exists, the refresh cycle during the self refresh operation cannot be set to 100 msec.

To solve this problem, the semiconductor device 100 according to the present embodiment stores the address of the memory cell with the information retaining time equal to or greater than 64 msec and less than 100 msec as the relief address RA into the address retaining circuit 154. As described above, because the relief address RA stored in the address retaining circuit 154 is frequently refreshed during the self refresh operation as compared to the other addresses, the information of the memory cell is not lost even if the refresh cycle during the self refresh operation is set to 100 msec. Because the refresh cycle is set to 64 msec in the auto refresh operation, the information of any of the memory cells is not lost. Because the relief address RA is not interrupted by the interrupt control circuit 153 during the auto refresh operation, all the memory cells are inevitably refreshed in the period of 64 msec even if the auto refresh command REF is issued in the concentrated refresh method.

Figure 4:
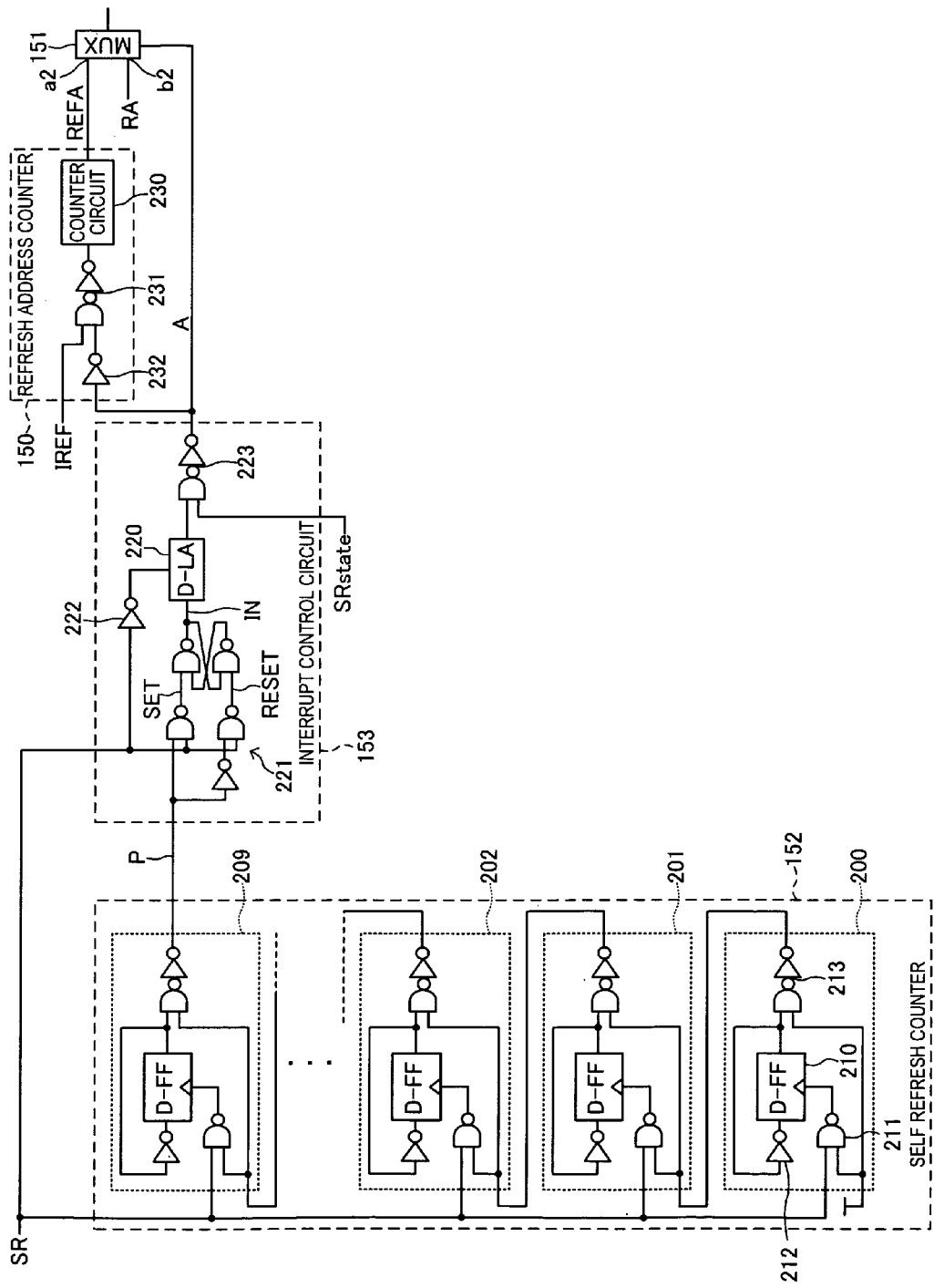
FIG. 4 is a circuit diagram of the semiconductor device 100.

FIG. 4 is a circuit diagram of the semiconductor device 100 according to the present embodiment, showing main components thereof in detail.

As shown in FIG. 4, the self refresh counter 152 includes ten cascade-connected flip-flop circuits 200 to 209. An output of the flip-flop circuit 209 on the top level is used as the detection pulse P. All the flip-flop circuits 200 to 209 have the same circuit configuration. Specifically, the flip-flop circuits include a data latch circuit (D-FF) 210, a NAND circuit 211 that has two inputs and supplies a latch pulse to a clock node of the data latch circuit 210, an inverter 212 that inverts a signal output from the data latch circuit 210 and supplies the signal to an input node, and an AND circuit 213 that has two inputs and receives output signals of the data latch circuit 210 and a flip-flop circuit on the preceding stage. The self refresh signal SR and a signal output from the flip-flop circuit on the preceding stage are supplied to the NAND circuit 211. Because of the absence of a signal output from a flip-flop circuit on the preceding stage of the flip-flop circuit 200, the signal of the flip-flop circuit 200, which is at the initial stage, is fixed to a high level.

With this configuration, the self refresh counter 152 functions as a 10-bit counter that counts the number of generation of the self refresh signal SR (self-refresh request signal). Therefore, the detection pulse P that is the output of the flip-flop circuit 209 on the top level is activated whenever the self refresh signal SR is generated 1023 ($=2^{10}-1$) times, and inactivated at the 1024th time.

The interrupt control circuit 153 includes a data latch circuit (D-LA) 220, an SR (set/reset) latch circuit 221 that supplies an output signal to an input node of the data latch circuit 220, an inverter 222 that supplies an inverted signal of the self refresh signal SR to a clock node of the data latch circuit 220, and an AND circuit 223 that has two inputs and receives a signal output from the data latch circuit 220 and a self-refresh state signal SR state. An output of the AND circuit 223 is used as the interrupt signal A. When the detection pulse P is at a low level, the SR latch circuit 221 is reset whenever the self refresh signal SR is activated, and when the detection pulse P is at a high level, the SR latch circuit 221 is set in response to the self refresh signal SR. The self-refresh state signal SR state is a state signal that is at a high level during the self refresh mode.

With this configuration, when the detection pulse P is activated during the self refresh mode, that is, when the self refresh signal SR is generated at the 1024th time, the interrupt signal A is activated. The interrupt signal A is retained in an active state until the next self refresh signal SR is generated. As shown in FIG. 4, the interrupt signal A is supplied to the refresh address counter 150 and the multiplexer 151.

The refresh address counter 150 includes a counter circuit 230, an AND circuit 231 that has two input nodes and supplies a count up (or count down) signal to the counter circuit 230, and an inverter 232 that supplies an inverted signal of the interrupt signal A to one of the input nodes of the AND circuit 231. The refresh command IREF is supplied to the other input node of the AND circuit 231.

The counter circuit 230 included in the refresh address counter 150 counts up (or counts down) whenever the refresh command IREF is activated. However, when the interrupt signal A is activated, the count up (or count down) operation is withheld and the count value remains the same. The count value of the counter circuit 230 is used as the refresh address REFA and supplied to one input node a2 of the multiplexer 151. The relief address RA is supplied to the other input node b2 of the multiplexer 151. Which of the input nodes a2 and b2 is to be selected is determined according to the interrupt signal A. That is, when the interrupt signal A is in an inactive state, the refresh address REFA is selected and when the interrupt signal A is in an active state, the relief address RA is selected.

Figure 5:
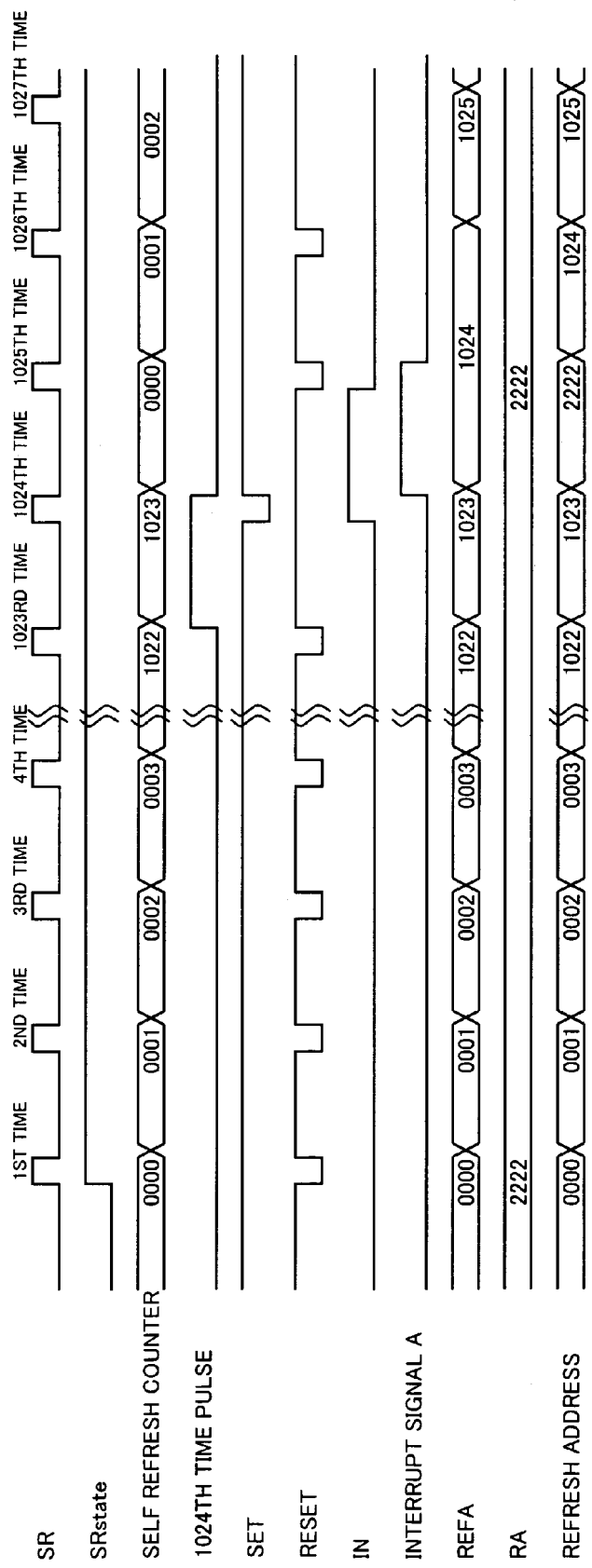
FIG. 5 is a timing chart for explaining operations of circuit sections shown in FIG. 4.

FIG. 5 is a timing chart for explaining operations of circuit sections shown in FIG. 4.

As shown in FIG. 5, whenever the self refresh signal SR is generated, the count values of the refresh address counter 150 and the self refresh counter 152 are incremented. Therefore, the initial count values of the refresh address counter 150 and the self refresh counter 152 are synchronized. Because a reset pulse RESET of the SR latch circuit 221 activates whenever the self refresh signal SR is generated, an input signal IN input into the data latch circuit 220 is maintained at a low level. Thus, the interrupt signal A is also maintained at a low level.

When the self refresh signal SR is generated at the 1023rd time, the detection pulse P changes to a high level. A set pulse SET of the SR latch circuit 221 is activated in response to the self refresh signal SR generated at the 1024th time. Due to this, the input signal IN input into the data latch circuit 220 is changed to a high level and the interrupt signal A is changed to a high level.

With this configuration, because the multiplexer 151 selects the input node b2, the relief address RA is output instead of the refresh address REFA. In the example shown in FIG. 5, a value of the relief address RA is #2222 and the relief address RA is refreshed. Furthermore, when the interrupt signal RA is activated, the count up of the refresh address counter 150 is temporarily stopped, therefore, the count up is not synchronized with the self refresh signal SR that is generated at the 1025th time. The count up of the refresh address counter 150 restarts from the self refresh signal SR that is generated at the 1026th time. The count up of the self refresh counter 152 is not stopped and the count up is always performed whenever the self refresh signal SR is generated.

Operations of the semiconductor device 100 according to the present embodiment are explained next.

Figure 6:
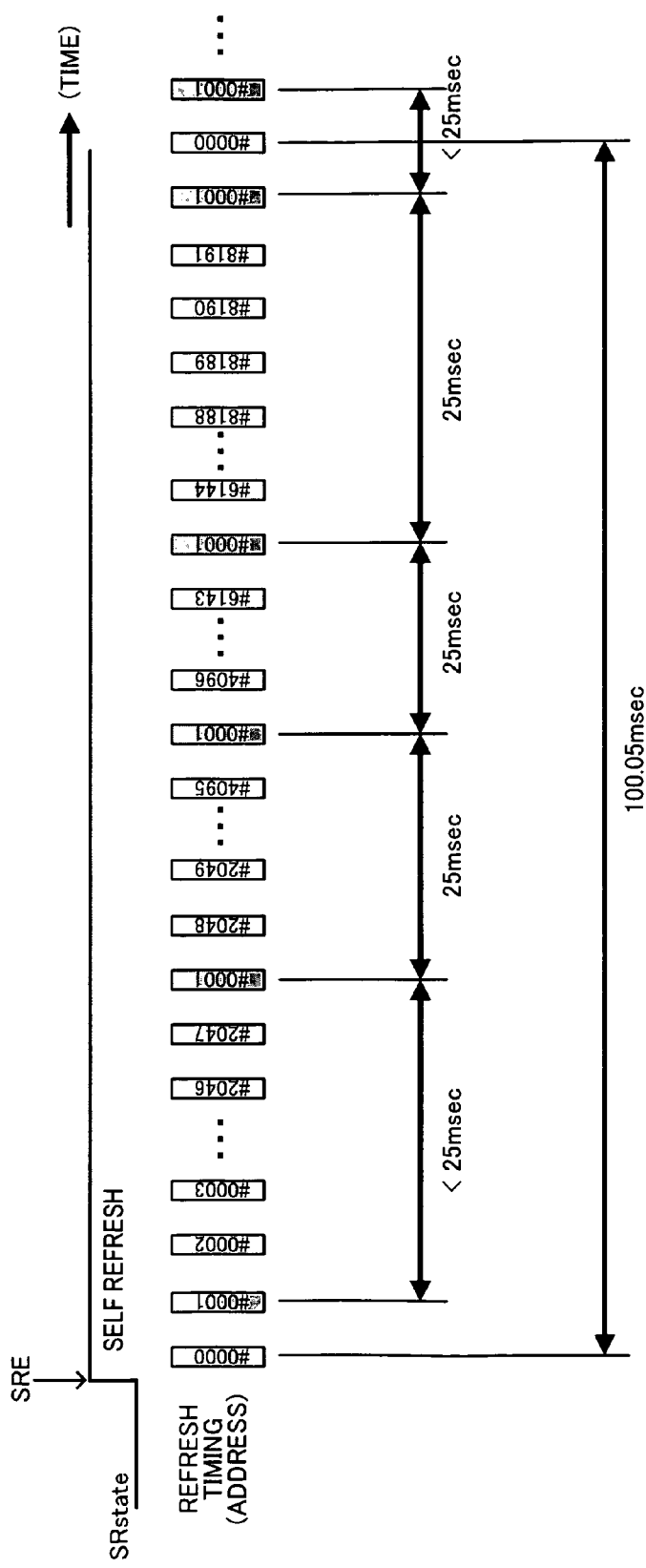
FIG. 6 is a timing chart for explaining operations of the semiconductor device 100 in a case where the self refresh mode is continued.
Figure 7:
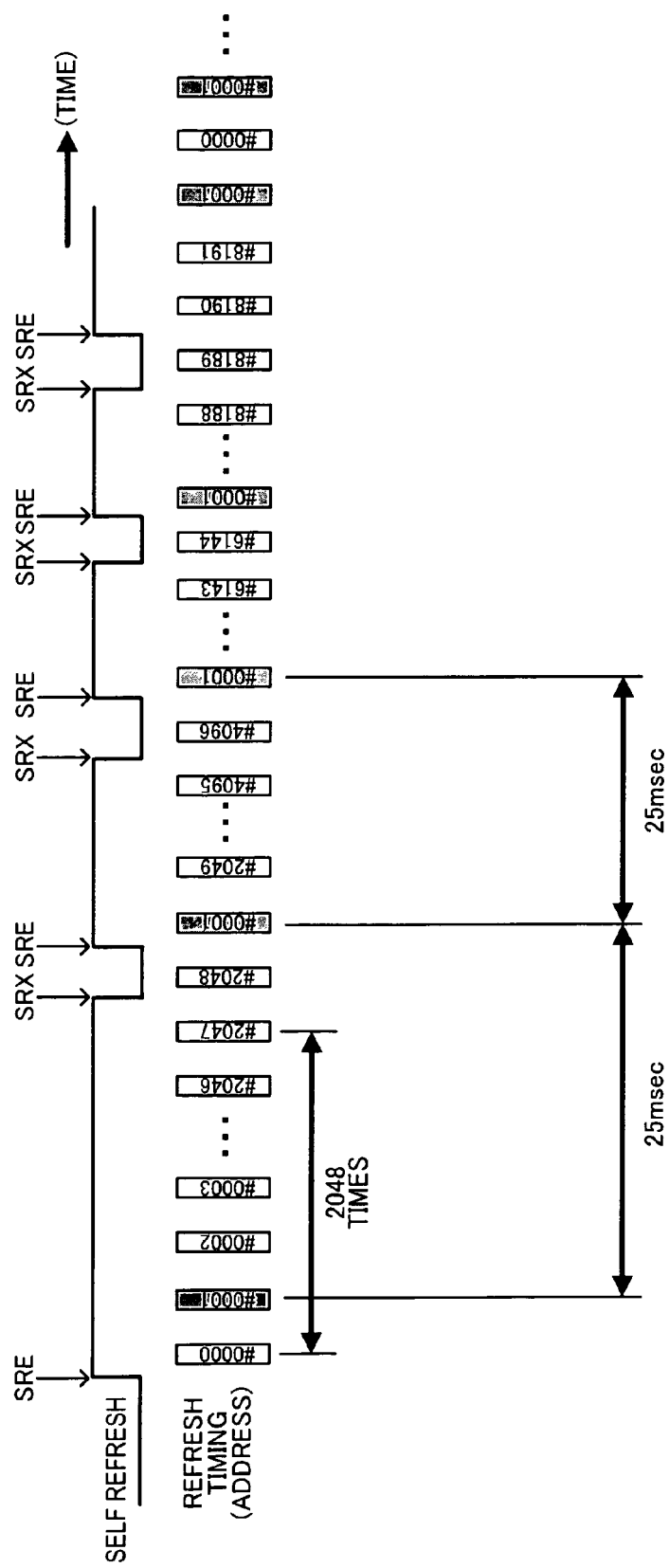
FIG. 7 is a timing chart for explaining operations of the semiconductor device 100 in a case where entry into and exit from the self refresh mode are repeated.

FIGS. 6 and 7 are timing charts for explaining operations of the semiconductor device 100 according to the present embodiment, where FIG. 6 shows a case where the self refresh mode is continued and FIG. 7 shows a case where entry into and exit from the self refresh mode are repeated. In both cases, the count value for one counting cycle of the refresh address counter 150 is 8192 and the self refresh counter 152 activates the detection pulse P whenever the self refresh signal SR is generated 2048 times. As an example, the relief address RA is #0001.

As shown in FIG. 6, when the self refresh mode continues, the refresh operation is always performed based on the self refresh signal SR. Due to this, the relief address RA #0001 is interrupted whenever the refresh command IREF is generated 2048 times. If the refresh cycle during the self refresh mode is assumed to be 100 msec, the refresh command IREF is generated at an interval of 12.21 μsec (=100 msec/8192); therefore, the relief address RA #0001 is refreshed after every 25 msec. Thus, even if the information retaining time of the memory cell identified by the relief address RA is less than 100 msec, the information is properly retained if the information retaining time is equal to or greater than 25 msec. If the information retaining time of the memory cell identified by the relief address RA (#0001) is equal to or greater than 64 msec, the information is properly retained even during the auto refresh operation.

The relief address RA (#0001) is interrupted whenever the refresh command IREF is generated 2048 times. Therefore, for the refresh address counter 150 to complete one cycle, the refresh command IREF needs to be generated 8192+4 times. Due to this, the refresh cycle increases by 100 msec+α (approximately equal to 100.05 msec); however, because the increased amount is negligible, the information is not likely to be lost. Furthermore, 100.05 msec is approximately equal to 100 msec×((8192 times+8192 times/2048 times)/8192 times).

Meanwhile, as shown in FIG. 7, when entry into and exit from the self refresh mode are repeated, the refresh operation is performed based on the self refresh signal SR and the auto refresh command REF. Therefore, in the refresh operation performed based on the self refresh signal SR, both the refresh address counter 150 and the self refresh counter 152 are counted up, whereas in the refresh operation performed based on the auto refresh command REF, only the refresh address counter 150 is counted up and the self refresh counter 152 is not counted up. Thus, when exiting from the self refresh mode, the count value of the self refresh counter 152 is retained. Thereafter, when re-entry is made into the self refresh mode, count up of the self refresh counter 152 restarts and the relief address RA (#0001) is refreshed whenever the count value reaches 2048.

That is, as shown in FIG. 7, all the points in time where the count value of the refresh address counter 150 is a multiple of 2048 (#2048, #4096, #6144) correspond to the exit from the self refresh mode; however, in the present embodiment, because the interruption of the relief address RA has no bearing on the refresh address counter 150, the relief address RA is not interrupted at these timings. The relief address RA is interrupted only after entering into the self refresh mode.

When an exit period from the self refresh mode is long, the relief address RA is not interrupted for a long time. However, because the auto refresh command REF is periodically issued upon exit from the self refresh node, as described above, the information is retained properly if the information retaining time of the memory cell identified by the relief address RA (#0001) is equal to or greater than 64 msec.

Figure 8:
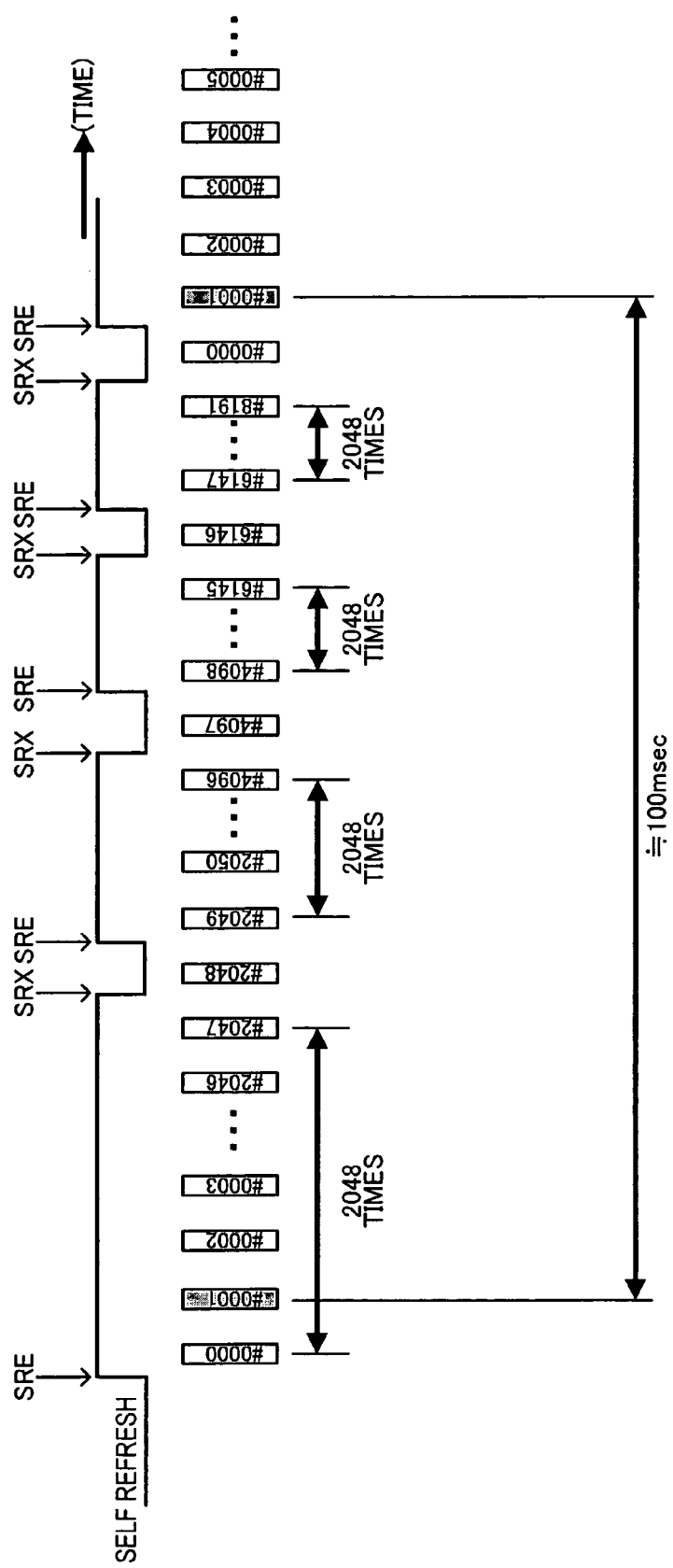
FIG. 8 is a timing diagram for explaining a problem of a comparative example with respect to the present invention.

FIG. 8 is a timing chart of a comparative example that is different from the technical concept of the present application. FIG. 8 shows a case where the relief address RA is interrupted in the self refresh mode based on the count value of the refresh address counter 150.

As shown in FIG. 8, when the relief address RA is interrupted in the self refresh mode based on the count value of the refresh address counter 150, the relief address RA is not interrupted for a longer period of time upon exit from the self refresh mode at a point in time where the count value of the refresh address counter 150 is a multiple of 2048 (#2048, #4096, #6144). As a result, the refresh cycle is likely to be set to approximately 100 msec for the relief address RA depending on the timing of the entry into and exit from the self refresh mode, and the information of the memory cell identified by the relief address RA is likely to be damaged.

The problem described above is solved by the configuration of the present embodiment explained above and operation waveforms of the configuration shown in FIG. 7. That is, the memory cell identified by the relief address RA can be frequently refreshed regardless of the timing of entry into and exit from the self refresh mode.

It is apparent that the present invention is not limited to the above embodiments, but may be modified and changed without departing from the scope and spirit of the invention.

For example, circuit types in respective circuit blocks shown in the drawings and circuits that generate other control signals are not limited to those shown in the drawings.

The basic technical concept of the present invention can be applied to various types of semiconductor devices. For example, the present invention can be applied to semiconductor devices in general, such as a CPU (Central Processing Unit), an MCU (Micro Control Unit), a DSP (Digital Signal Processor), an ASIC (Application Specific Integrated Circuit), an ASSP (Application Specific Standard Circuit), or a Memory. For example, an SOC (System on Chip), an MCP (Multi Chip Package), and a POP (Package on Package) can be mentioned as product formats of such a semiconductor device to which the present invention is applied. The present invention is applicable to semiconductor devices with the above arbitrary product format or package format.

When an FET (Field Effect Transistor) is used as the transistor in the present invention, various types of FETs such as MIS (Metal-Insulator Semiconductor) and TFT (Thin Film Transistor) can be used as well as MOS (Metal Oxide Semiconductor). Furthermore, the semiconductor device can include bipolar transistors.

In addition, a PMOS transistor (P-channel MOS transistor) is a representative example of a second conductive transistor, and an NMOS transistor (N-channel MOS transistor) is a representative example of a first conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:
1. A semiconductor device comprising:
a first circuit that generates a refresh command in a predetermined cycle asynchronous with outside;
a second circuit that generates a refresh address in response to the refresh command and updates the refresh address and outputs the refresh address;
a third circuit that stores a relief address;
a fourth circuit that counts number of generation of the refresh command and activates an interrupt signal when a count value thereof reaches a predetermined value;
a fifth circuit that selects the refresh address output from the second circuit when the interrupt signal is in an inactive state, and selects the relief address stored in the third circuit when the interrupt signal is in an active state; and
a sixth circuit that performs a refresh operation to memory cells specified by the refresh address or the relief address selected by the fifth circuit, wherein
the second circuit temporarily stops updating the refresh address in response to activation of the interrupt signal.
2. The semiconductor device as claimed in claim 1, wherein the fourth circuit activates the interrupt signal a power of two times in a period that be shown from a time when the second circuit outputs a predetermined refresh address to a time when the second circuit outputs the predetermined refresh address next time in a state where the first circuit is activated.
3. The semiconductor device as claimed in claim 2, wherein a memory cell specified by the relief address has a first information retaining time that is shorter than a second information retaining time of a memory cell specified by an address different from the relief address.
4. The semiconductor device as claimed in claim 3, wherein the first information retaining time is longer than a first refresh cycle that is a period from a time when the second circuit outputs a predetermined refresh address to a time when the second circuit outputs the predetermined refresh address next time without the first circuit being activated.

5. The semiconductor device as claimed in claim 4, wherein the first refresh cycle is shorter than a second refresh cycle which is a period from a time when the second circuit outputs the predetermined refresh address to a time when the second circuit outputs the predetermined refresh address next time with the first circuit being activated.

6. The semiconductor device as claimed in claim 5, wherein the first information retaining time is shorter than the second refresh cycle.

7. The semiconductor device as claimed in claim 5, wherein the second information retaining time is longer than the second refresh cycle.

8. The semiconductor device as claimed in claim 1, wherein the first circuit is activated in response to a self-refresh entry command issued from outside, and is inactivated in response to a self-refresh exit command issued from outside.

9. The semiconductor device as claimed in claim 1, wherein the second circuit outputs and updates the refresh address even when an auto refresh command is issued from outside.

10. The semiconductor device as claimed in claim 1, wherein the third circuit stores the relief address in a nonvolatile manner.

11. A semiconductor device comprising:
a refresh-command generating circuit that enters into a self refresh mode in response to a self refresh command issued once from outside of the semiconductor device, the refresh-command generating circuit periodically activating a plurality of first refresh commands during the self refresh mode, and activating a second refresh command once in response to an auto refresh command issued once from outside of the semiconductor device during not the self refresh mode;
a refresh address counter that updates a count value in response to activation of either the first refresh commands or second refresh command, the count value indicating an address to be refreshed;
a self refresh counter that updates a count value in response to activation of the first refresh commands; and
a control circuit that generates an interrupt signal when the count value of the self refresh counter indicates a predetermined value, wherein the control circuit performs a refresh operation for a relief address instead of an address supplied from the refresh address counter and suspends counting of the refresh address counter when both ones of the first refresh commands and the interrupt signal are activated, and the control circuit further performs a refresh operation for an address supplied from the refresh address counter and permits counting of the refresh address counter in response to activation of ones of the first refresh commands when the interrupt signal is not activated.

12. The semiconductor device as claimed in claim 11, wherein the control circuit activates the interrupt signal a power of two times in a period that be shown from a time when the refresh address counter outputs a predetermined refresh address to a time when the refresh address counter outputs the predetermined refresh address next time during the self refresh mode.

13. The semiconductor device as claimed in claim 12, wherein the control circuit further performs the refresh operation for the address supplied from the refresh address counter and permits counting of the refresh address counter in response to activation of the second refresh command regardless of a count value of the self refresh counter.

14. The semiconductor device as claimed in claim 13, wherein a memory cell specified by the relief address has a first information retaining time that is shorter than a second information retaining time of a memory cell specified by an address different from the relief address.

15. The semiconductor device as claimed in claim 14, wherein the first information retaining time is longer than a first refresh cycle that is a period from a time when the refresh address counter outputs a predetermined refresh address to a time when the refresh address counter outputs the predetermined refresh address next time without entering in the self refresh mode.

16. The semiconductor device as claimed in claim 15, wherein the first refresh cycle is shorter than a second refresh cycle which is a period from a time when the refresh address counter outputs a predetermined refresh address to a time when the refresh address counter outputs the predetermined refresh address next time during the self refresh mode.

* * * * *